Sept. 16, 1958 A. NUUT 2,852,625

HIGH INPUT IMPEDANCE TRANSISTOR AMPLIFIER

Filed June 3, 1957

August Nuut
INVENTOR

BY [signature]

ATTORNEY 2,852,625
Patented Sept. 16, 1958

2,852,625

HIGH INPUT IMPEDANCE TRANSISTOR AMPLIFIER

August Nuut, Glendale, Calif., assignor to Hycon Mfg. Company, Pasadena, Calif., a corporation of Delaware Application June 3, 1957, Serial No. 663,221

6 Claims. (Cl. 179—171)

This invention relates generally to transistor amplifiers and more particularly to a high input impedance, low noise transistor amplifier.

It is an object of this invention to provide a transistor amplifier which has a high input impedance, to prevent loading of high impedance sources connected to the amplifier.

Another object of the invention is to provide a transistor amplifier that is stabilized for high temperature operation.

Another object of the invention is to provide a transistor amplifier in which low noise performance is obtained.

A further object of this invention is to provide a high input impedance, low noise, and temperature stabilized transistor amplifier of simple circuitry.

Briefly, the foregoing and other objects are preferably accomplished by providing a pair of transistors connected in a different amplifier circuit in which an input signal is applied to one transistor and an output signal is obtained from the second transistor, the differential amplifier circuit including a bias circuit for biasing both transistors. The output signal is amplified by a high gain amplifier and suitably fed back as a negative feed back input signal to the second transistor. The feedback signal is also applied through the bias circuit to the first transistor as a positive feedback signal. The positive and negative feedback signals effectively produce a high input impedance. The output of the high gain amplifier is connected to a load.

Other objects and features of the invention will be set forth in the following detailed description to be read in conjunction with the accompanying drawings, in which.

Figure 1:
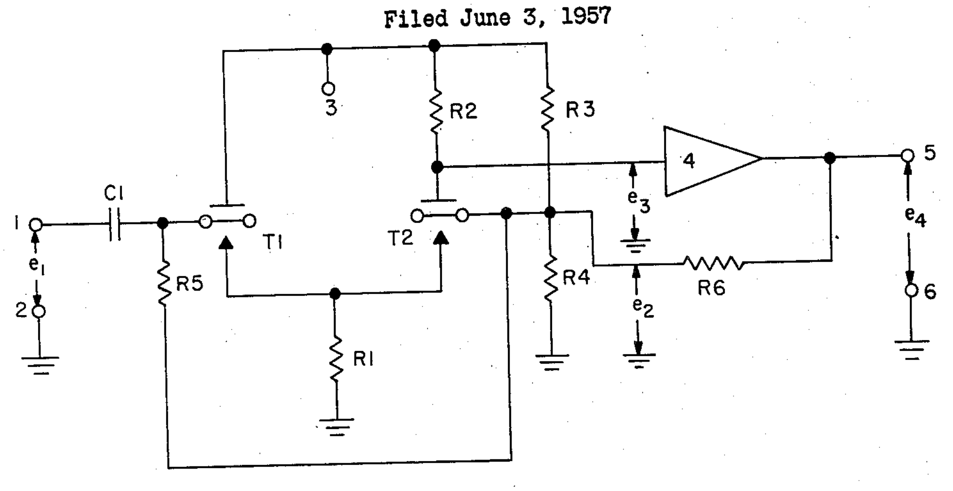
Figure 1 is a circuit diagram of a preferred embodiment of this invention.

A preferred embodiment of the invention is shown in Figure 1. An input signal can be applied between input terminals 1 and 2. Input terminal 1 is capacitively coupled to the base of transistor T1 through capacitor C1. The emitter of transistor T1 and the emitter of transistor T2 are connected together, and both emitters are connected to ground through resistor R1. The collector of transistor T1 is connected directly to the negative terminal 3 of a power supply, the positive terminal (not shown) of which is grounded. Similarly, the collector of transistor T2 is also connected to the negative terminal 3 of the power supply except, however, through a resistor R2.

The negative terminal 3 is connected to ground through two series connected resistors R3 and R4, and the common junction of the resistors R3 and R4 is connected directly to bias the base of transistor T2. A resistor R5 connects the bases of transistors T1 and T2 together, as shown. This forms a differential amplifier as can be recognized.

The collector of transistor T2 is connected to the input of an amplifier 4 having a gain of approximately 2500, for example. Amplifier 4 is not phase inverting; that is, its output remains in phase with its input over the band of frequencies one desires to amplify. The output of amplifier 4 is connected to output terminal 5 and a load can be connected across the output terminals 5 and 6 (grounded). A feedback resistor R6 connects the output of amplifier 4 (terminal 5) to the common junction of the series resistors R3 and R4.

Figure 2:
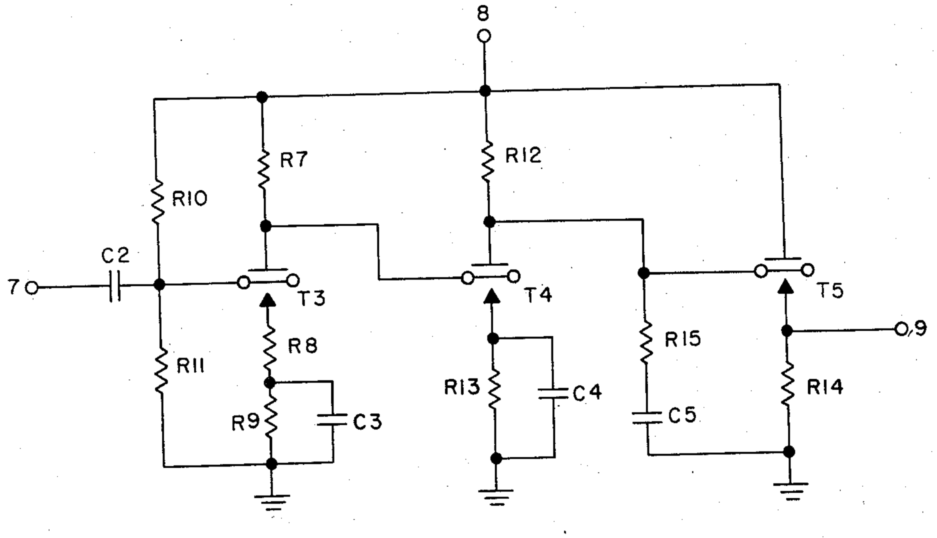
Figure 2 is a detailed circuit diagram of a preferred high gain amplifier used in the invention.

Amplifier 4 is illustrated in detail in Figure 2, which is a preferred, three stage amplifier circuit. Of course, other high gain amplifiers which are not phase inverting can also be used. Input terminal 7 is coupled through capacitor C2 to the base of transistor T3. The collector of transistor T3 is connected through resistor R7 to the negative terminal 8 of a power supply having the positive termminal (not shown) grounded. The emitter is connected to ground through two series connected resistors R8 and R9, resistor R9 being bypassed by capacitor C3. One end of resistor R10 is connected to negative terminal 8 and the other end is connected to one end of resistor R11 which is grounded on the other end. The base of transistor T3 is biased by connection to the common junction of the series connected resistors R10 and R11 which form a divider.

The amplified output from the collector of transistor T3 is connected to the base of transistor T4. The collector of transistor T4 is connected to negative terminal 8 through resistor R12 and the emitter is grounded through resistor R13 which is bypassed by capacitor C4. An amplified output is again obtained from the collector of transistor T4 and is applied to the base of emitter follower transistor T5. The collector of transistor T5 is directly connected to negative terminal 8 and the emitter is connected to ground through resistor R14. The base of transistor T5 is connected to ground by an integral damping network consisting of the series combination of resistor R15 and capacitor C5 for the purpose of compensating phase shift outside the desired frequency band and thereby preventing self-oscillation. Output terminal 9 is connected directly to the emitter of transistor T5.

The operation of the invention can be described by considering circuit behavior on application of an input signal $e_1$ across input terminals 1 and 2. A feedback signal $e_2$ (across resistor R4) is produced as described following, and is applied to the base of transistor T2 and to the lower end of resistor R5. The output signal $e_3$ resulting from transistor T2 is substantially the difference between the input signals $e_1$ and $e_2$. The signal $e_3$ is amplified without phase reversal by the amplifier 4 in a straight forward manner to produce an output signal $e_4$ which is applied a load connected across output terminals 5 and 6. Output signal $e_4$ is attenuated by resistor R6 to become $e_2$, the feedback signal. With very large loop gains, $e_2$ is approximately equal to the input signal $e_1$.

It is easily seen that the feedback signal $e_2$ is applied as negative feedback to the base of transistor T2 and as positive feedback through resistor R5 to the base of transistor T1. The effect due to the negative feedback to transistor T2 is to effectively multiply the emitter load impedance of transistor T1 by the base to emitter current gain of the transistor, which is approximately 90 in the example shown in Figure 1. The effective resistance seen through resistor R5 is equal to the voltage difference between $e_1$ and $e_2$ divided by the current through R5. Since $e_2$ is approximately equal to $e_1$, and these voltages are in phase, the current which flows through R5 is very small, and the resistance through R5 appears very high.

Very high resistances therefore are seen both through resistor R5 and the input (emitter load) impedance of transistor T1, such that the net effective input impedance, which is the parallel value of the input impedance of T1 and the effective value of R5, is very large. In practice, values ranging between 100,000 ohms and 500,000 ohms are practicable at temperatures up to 70° C. Of course, it should be remembered that the input impedance cannot be greater than the base to collector impedance of the transistor T1.

It has been determined empirically that low noise performance can be obtained with transistors operated with collector to emitter voltages in the order of ½ to 1½ volts and collector currents in the order of ½ to 1 milliampere. For bias stability, the common emitter resistor R1 should be equal or sufficiently large compared to the base biasing resistors R5 and the parallel combination of R3 and R4, such that current increase due to temperature rise will be generally diverted through the biasing resistors. This reduces the possible formation of a runaway current.

The value of resistor R2 is chosen at a low value. The voltage drop across R2 thus varies less markedly as the result of current changes due to temperature rises, and it is more difficult for transistor T2 to saturate at high temperatures. In a range of low values of R2, the resistor R2 provides an optimum source impedance which minimizes the noise contribution of the following stage.

Low noise operation and bias stability at high temperatures is obtained by choice of operating point. With a supply voltage (terminal 3) of 20 volts, for example, transistor T1 is chosen to operate with approximately 3½ volts from emitter to collector, which permits some change in operating point with temperature. Suitable component values can then be made as stated.

The following component values meeting the above requirements provide a circuit having a high input impedance, low noise and is stabilized for high temperature operation. The specific values and component types listed are not intended to restrict the scope of the invention, but merely illustrate an actual circuit which will demonstrate the invention and perform satisfactorily.

| | |
|---|---|
| Supply voltage on Terminal 3 | 20 volts (negative) |
| Supply voltage on Terminal 8 | 26 volts (negative) |
| Transistors T1, T2, T3, T4, T5 | 2N132 |
| C1 | .01 mfd. |
| C2 | 50 mfd. |
| C3 | 50 mfd. |
| C4 | 10 mfd. |
| C5 | .05 mfd. |
| R1 | 6.8K ohms |
| R2 | 1K ohms |
| R3 | 3K ohms |
| R4 | 12K ohms |
| R5 | 5.1K ohms |
| R6 | 510K ohms |
| R7 | 18K ohms |
| R8 | 150 ohms |
| R9 | 1.8K ohms |
| R10 | 20K ohms |
| R11 | 2K ohms |
| R12 | 10K ohms |
| R13 | 4.3K ohms |
| R14 | 11K ohms |
| R15 | 1K ohms |

A transistor amplifier having a high input impedance which prevents loading of high impedance sources is thus provided. The equivalent input noise due to the circuit is comparable to a well designed grounded emitter stage, and the circuit is stabilized for high temperature operation.

It is to be understood that the particular embodiment of the invention described above and shown in the drawings is merely illustrative of and not restrictive on the broad invention, and that various changes in design, structure and arrangement may be made without departing from the spirit and scope of the broader of the appended claims.

What is claimed is:

1. A transistor amplifier having a high input impedance, comprising: a pair of transistors connected in a differential amplifier circuit, said differential amplifier circuit including means for biasing said transistors; means for applying an input signal to one of said transistors, an output signal being derived from the other; amplifier means having an input and an output, said other transistor output signal being applied to the input of said amplifier means; and feedback means connecting the output of said amplifier means to said biasing means, said biasing means connected to apply said amplifier means output as positive feedback to said transistor receiving said input signal, and as negative feedback to said other transistor, whereby a high input impedance is obtained.

2. The invention according to claim 1 in which said biasing means includes a divider network for supplying bias directly to said other transistor, and through a resistor to said transistor receiving said input signal.

3. The invention according to claim 1 in which said transistors are junction transistors, said differential amplifier circuit having base inputs, emitters adapted to be grounded, and a collector output.

4. A transistor amplifier having a high input impedance, comprising: a pair of transistors each having a base, emitter and collector, said emitters being connected together; means for applying an input signal to the base of one of said transistors, an output signal being derived from the collector of the other transistor; a first resistor connecting said bases together; a second resistor connected on one end to said emitters; a third resistor connected on one end to the collector of said other transistor; a power supply connecting the collector of said transistor receiving said input signal and the other end of said third resistor to the other end of said second resistor; a divider comprising a fourth resistor connected in series with a fifth resistor, the common junction thereof being connected to the base of said other transistor, and said divider being connected across said power supply; a nonphase inverting amplifier having an input and an output, said output signal from the collector of said other transistor being applied to the input of said amplifier; and feedback means connecting the output of said amplifier to the common junction of said fourth and fifth resistors for providing feedback to said transistors.

5. The invention according to claim 4 wherein the value of said second resistor is effectively at least equal to the value of said first resistor, and the parallel value of said fourth and fifth resistors is lower than the value of said second resistor.

6. The invention according to claim 4 wherein the value of said third resistor is low, in the order of 1000 ohms.

No references cited.